United States Patent
Doi et al.

(10) Patent No.: US 10,672,973 B2
(45) Date of Patent: Jun. 2, 2020

(54) COMPOSITION FOR FORMING CE-DOPED PZT-BASED PIEZOELECTRIC FILM

(71) Applicant: MITSUBISHI MATERIALS CORPORATION, Tokyo (JP)

(72) Inventors: Toshihiro Doi, Naka-gun (JP); Hideaki Sakurai, Naka-gun (JP); Nobuyuki Soyama, Matsudo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 219 days.

(21) Appl. No.: 15/127,981

(22) PCT Filed: Mar. 20, 2015

(86) PCT No.: PCT/JP2015/058618
§ 371 (c)(1),
(2) Date: Sep. 21, 2016

(87) PCT Pub. No.: WO2015/146863
PCT Pub. Date: Oct. 1, 2015

(65) Prior Publication Data
US 2017/0110648 A1   Apr. 20, 2017

(30) Foreign Application Priority Data

Mar. 27, 2014   (JP) .................... 2014-065627

(51) Int. Cl.
*H01L 41/187* (2006.01)
*H01L 41/318* (2013.01)
(Continued)

(52) U.S. Cl.
CPC ........ *H01L 41/1876* (2013.01); *C01G 25/006* (2013.01); *C04B 35/491* (2013.01);
(Continued)

(58) Field of Classification Search
CPC .................................................. H01L 41/1876
See application file for complete search history.

(56) References Cited

U.S. PATENT DOCUMENTS

2004/0132221 A1*  7/2004  Kobayashi ............... B41J 2/161
                                                                438/3
2008/0152530 A1*  6/2008  Yu .......................... C01G 21/06
                                                                419/10

(Continued)

FOREIGN PATENT DOCUMENTS

CN   102046563 A   5/2011
CN   103086715 A   5/2013

(Continued)

OTHER PUBLICATIONS

Majumder. Effect of cerium doping on the micro-structure and electrical properties of sol-gel derived b1.05(Zr0.53-dCedTi0. 47)O3 (d<10 at.%) thin films. Materials Science and Engineering B98 (2003) 25/32 (Year: 2003).*

(Continued)

*Primary Examiner* — Matthew E. Hoban
(74) *Attorney, Agent, or Firm* — Locke Lord LLP; James E. Armstrong, IV; Nicholas J. DiCeglie, Jr.

(57) ABSTRACT

A composition for forming a Ce-doped PZT-based piezoelectric film contains: PZT-based precursors containing metal atoms configuring the composite metal oxides; a diol; and polyvinylpyrrolidone. The PZT-based precursors are contained so that a metal atom ratio (Pb:Ce:Zr:Ti) in the composition satisfies (1.00 to 1.28):(0.005 to 0.05):(0.40 to 0.55):(0.60 to 0.45) and the total of Zr and Ti in a metal atom ratio is 1. A concentration of the PZT-based precursor in 100 mass % of the composition is from 17 mass % to 35 mass % in terms of an oxide concentration, a rate of diol in 100 mass % of the composition is from 16 mass % to 56 mass (Continued)

%, and a molar ratio of polyvinylpyrrolidone to 1 mole of the PZT-based precursor is 0.01 moles to 0.25 moles in terms of monomers.

4 Claims, 4 Drawing Sheets

(51) Int. Cl.
*C01G 25/00* (2006.01)
*C04B 35/491* (2006.01)
*C04B 35/622* (2006.01)
*C04B 35/624* (2006.01)
*C04B 35/626* (2006.01)
*C04B 35/634* (2006.01)
*C04B 35/638* (2006.01)
*C04B 35/64* (2006.01)
*C09D 5/24* (2006.01)

(52) U.S. Cl.
CPC ........ *C04B 35/624* (2013.01); *C04B 35/6264* (2013.01); *C04B 35/62218* (2013.01); *C04B 35/638* (2013.01); *C04B 35/63444* (2013.01); *C04B 35/64* (2013.01); *C09D 5/24* (2013.01); *H01L 41/318* (2013.01); *C01P 2002/54* (2013.01); *C04B 2235/3229* (2013.01); *C04B 2235/3234* (2013.01); *C04B 2235/3249* (2013.01); *C04B 2235/3296* (2013.01); *C04B 2235/48* (2013.01)

(56) References Cited

U.S. PATENT DOCUMENTS

| | | |
|---|---|---|
| 2011/0098173 A1 | 4/2011 | Fujii et al. |
| 2013/0256580 A1 | 10/2013 | Doi et al. |
| 2014/0287251 A1 | 9/2014 | Doi et al. |

FOREIGN PATENT DOCUMENTS

| | | |
|---|---|---|
| CN | 103130504 A | 6/2013 |
| CN | 103360062 A | 10/2013 |
| JP | 2010-206151 A | 9/2010 |
| JP | 2013-211309 A | 10/2013 |
| JP | 2014-187266 A | 10/2014 |

OTHER PUBLICATIONS

Balgovind Tiwari et al., "Study of Impedance Parameters of Cerium Modified Lead Zirconate Titanate Ceramics", IEEE Transactions on Dielectrics and Electrical Insulation vol. 17 No. 1, Feb. 2010, pp. 5-17. (cited in the Jan. 23, 2018 CN OA).

S. B. Majumder et al., "Optical and microstructural characterization of sol-gel derived cerium-doped PZT thin films", Journal of Materials Science vol. 32, 1997, pp. 2141-2150. (cited in the Jan. 23, 2018 CN OA).

Office Action dated Jan. 23, 2018, issued for the Chinese patent application No. 201580015351.2 and English translation thereof.

Jong-Jin Choi et al., "Preparation of Pb(Zr,Ti)O3 Thick Film Using a Mixture of Highly Concentrated Sol and Nanopowder Dispersed in Nitric Acid", Japanese Journal of Applied Physics, Part 1 (Regular Papers, Short Notes & Review Papers) Japan Society of Applied Physics Through the Institute of Pure and Applied Physics Japan, vol. 46, No. 6A, Jun. 2007, pp. 3549-3555 and a cover page. (cited in the Oct. 5, 2017 EP Search Report).

S. B. Majumder et al., "Effect of cerium doping on the microstructure and electrical properties of sol-gel derived Pb 1.05 (Zr 0.53-delta Ce delta Ti 0.47) O3 (delta =< 10 at. %) thin films", Materials Science and Engineering, Elsevier, Amsterdam, NL, vol. 98, No. 1, Feb. 25, 2003, pp. 25-32. (cited in the Oct. 5, 2017 EP Search Report).

Supplementary European Search Report dated Oct. 5, 2017, issued for the European patent application No. 15767978.8.

Jian Zhong et al., "Effect of Nb Doping on Highly[100]-Textured PZT Films Grown on CSD-Prepared PbTiO3 Seed Layers," Integrated Ferroelectrics, 130, 2011, pp. 1-11.

International Search Report dated Jun. 9, 2015, issued for PCT/JP2015/058618 and English translation thereof.

* cited by examiner

COMPOSITION FOR FORMING CE-DOPED PZT-BASED PIEZOELECTRIC FILM

TECHNICAL FIELD

The present invention relates to a composition for forming a Ce-doped PZT-based piezoelectric film used in a piezoelectric element, an integrated passive device (IPD), or a pyroelectric element.

Priority is claimed on Japanese Patent Application No. 2014-065627, filed Mar. 27, 2014, the content of which is incorporated herein by reference.

BACKGROUND ART

Patent Document 1 discloses a composition for forming a ferroelectric thin film for forming one kind of ferroelectric thin film selected from the group consisting of PLZT, PZT, and PT, which is a liquid composition for forming a thin film formed of a mixed composite metal oxide in which a composite metal oxide B containing Ce is mixed with a composite metal oxide A represented by a general formula $(Pb_xLa_y)(Zr_zTi_{(1-z)})O_3$. The liquid composition is a composition for forming a ferroelectric thin film formed of an organic metal compound solution in which a raw material for configuring the composite metal oxide A and a raw material for configuring the composite metal oxide B are dissolved in an organic solvent at a ratio so as to have a metal atom ratio represented by the general formula. In this composition for forming a ferroelectric thin film, x, y, and z in the general formula satisfy a relationship of $0.9<x<1.3$, a relationship of $0 \leq y<0.1$, and a relationship of $0 \leq z<0.9$, respectively.

When a ferroelectric thin film is formed using the composition for forming a ferroelectric thin film configured as described above, it is possible to obtain a ferroelectric thin film which has substantially the same dielectric constant as that of a typical ferroelectric thin film and a low leak current density and the ferroelectric thin film which is suitable for a high-capacitance density thin film capacitor is obtained by a simple method. Accordingly, in a case where substantially the same level of leak current density as that of a typical ferroelectric thin film is obtained, a thinner film can be obtained and a higher dielectric constant is obtained.

It is known that piezoelectric properties are improved by adding Nb to a PZT-based thin film represented by $PbZr_xTi_{1-x}O_3$ formed by using a sol-gel method (for example, see Non-Patent Document 1). In Non-Patent Document 1, effects exhibited when doping with Nb is performed on a {100}-oriented PZT-based thin film grown on a seed layer of $PbTiO_3$ prepared by using a chemical solution deposition (CSD) method were investigated. Specifically, effects exhibited when doping with Nb within a range of 0 atom % to 4 atom % is performed on a {100}-oriented $Pb_{1.1}Zr_{0.52}Ti_{0.48}O_3$ thin film having a thickness of 1 μm were investigated. As a result, a high degree of {100} orientation of 97% was obtained in the entire film due to the incorporation of a $Pb_{1.05}TiO_3$ thin seed layer having a thickness of several nm. In addition, maximum polarization, residual polarization, squareness, and a saturated holding force of the entire PZT-based thin film were generally decreased together with a doping level of Nb. The PZT-based thin film doped with 3% of Nb shows the highest piezoelectric constant $-e_{31,f}$ of 12.9 $C/cm^2$, which is higher than other thin films having other doping levels by 5% to 15%.

CITATION LIST

Patent Document

[Patent Document 1] Japanese Unexamined Patent Application, First Publication No. 2010-206151 (Claim 1 and Paragraph [0022])

Non-Patent Document

[Non-Patent Document 1] Jian Zhong et al. "Effect of Nb Doping on Highly[100]-Textured PZT Films Grown on CSD-Prepared $PbTiO_3$ Seed Layers", Integrated Ferroelectrics, 130 (2011) 1-11.

DISCLOSURE OF INVENTION

Technical Problem

However, in the composition for forming a ferroelectric thin film disclosed in Patent Document 1, a thickness of a coating film per 1 layer is limited to be equal to or smaller than 100 nm, and thus, productivity was low. In addition, in the composition for forming a ferroelectric thin film disclosed in Patent Document 1, in a case where a sol-gel solution was formed by using a chemical solution deposition (CSD) method, when a film thickness per 1 layer is equal to or greater than 100 nm, a dense and high-performance film is hardly obtained and it is difficult to improve productivity. In contrast, in a technology for improving piezoelectric properties of a PZT-based thin film by adding Nb as disclosed in Non-Patent Document 1, a piezoelectric constant is improved when a Nb-doped PZT thin film (PNbZT thin film) is formed by using a wet method, that is, a sol-gel solution is formed by using a CSD method, but a dielectric constant may be increased and it is difficult to use the film as a device such as a sensor.

In the present invention, a first object is to provide a composition for forming a Ce-doped PZT-based piezoelectric film which can improve a piezoelectric constant of a piezoelectric film, decrease a dielectric constant, and omit a polarization process, by performing the doping with Ce. In the present invention, a second object is to provide a composition for forming a Ce-doped PZT-based piezoelectric film which can obtain a dense and high-performance piezoelectric film without generating voids or cracks, even with a comparatively great single coating thickness, and realize crystallization in single sintering.

Solution to Problem

In a first aspect of the present invention, there is provided a composition for forming a PZT-based piezoelectric film formed of Ce-doped composite metal oxides, the composition including: PZT-based precursors containing metal atoms configuring the composite metal oxides; a diol; and polyvinylpyrrolidone or polyethylene glycol, in which the PZT-based precursors are contained so that a metal atom ratio (Pb:Ce:Zr:Ti) in the composition satisfies (1.00 to 1.20):(0.005 to 0.05):(0.40 to 0.55):(0.60 to 0.45) and the total of Zr and Ti in a metal atom ratio is 1 in the composition, a concentration of the PZT-based precursor in 100 mass % of the composition is from 17 mass % to 35 mass % in terms of an oxide concentration, a rate of diol in 100 mass % of the composition is from 16 mass % to 56 mass %, and a molar ratio of polyvinylpyrrolidone or polyethylene glycol to 1 mole of the PZT-based precursor is 0.01 moles to 0.25 moles in terms of monomers.

In a second aspect of the present invention, the composition for forming a PZT-based piezoelectric film according to the first aspect of the present invention, it is preferable that the composition further include linear monoalcohol having 6 to 12 carbon atoms of which a rate added in 100 mass % of the composition is from 0.6 mass % to 10 mass %

Advantageous Effects of Invention

When a piezoelectric film is formed by using the composition for forming a Ce-doped PZT-based piezoelectric film according to the first aspect of the present invention, it is possible to improve a piezoelectric constant by performing doping with Ce, and thus, it is possible to obtain greater displacement and to decrease a dielectric constant. Accordingly, in a case of using this piezoelectric film as a sensor, the advantages are increased. This may be because the domain (segregations having aligned crystal orientation, that is, regions having the same inner electric field direction in grain) is hardly moved by doping a film which is orientation-controlled to (100) plane with Ce, and polarization directions are aligned immediately after the film is formed. Further, since the content of polyvinylpyrrolidone or polyethylene glycol is comparatively small, a high-temperature process at the time of forming a film can be simplified, production efficiency can be improved, and an effect of decreasing residual stress of a film is obtained.

In the composition for forming a Ce-doped PZT-based piezoelectric film according to the second aspect of the present invention, linear monoalcohol having 6 to 12 carbon atoms having a high boiling point and low affinity is added to a sol-gel solution at a predetermined rate. Accordingly, when forming a piezoelectric film by using this composition, even when a coating thickness per single coating is comparatively as great as 100 nm to 250 nm, it is possible to obtain a dense and high-performance thin film, without generating voids or cracks. Even when a coating thickness per two times of coating is as great as 200 nm to 500 nm, crystallization can be realized in single sintering.

BEST MODE FOR CARRYING OUT THE INVENTION

Next, an embodiment for realizing the present invention will be described with reference to the drawings. A composition of the present invention is prepared for forming a PZT-based piezoelectric film formed of Ce-doped composite metal oxides. This composition contains PZT-based precursors containing each metal atom configuring the composite metal oxides, a diol, and polyvinylpyrrolidone or polyethylene glycol. A concentration of the PZT-based precursor in 100 mass % of the composition is from 17 mass % to 35 mass % in terms of an oxide concentration, a rate of diol in 100 mass % of the composition is from 16 mass % to 56 mass %, and a molar ratio of polyvinylpyrrolidone or polyethylene glycol to 1 mole of the PZT-based precursor is 0.01 moles to 0.25 moles in terms of monomers. It is preferable that linear monoalcohol having 6 to 12 carbon atoms is added to the composition and a rate thereof added is from 0.6 mass % to 10 mass % with respect to 100 mass % of the composition.

The Ce-doped PZT-based piezoelectric film formed by the composition of the present invention is a piezoelectric film in which Ce elements are added to Pb-containing composite metal oxides having a perovskite structure such as lead zirconate titanate (PZT). The Ce-doped PZT-based precursor contained in the composition is a raw material for configuring the composite metal oxides in the formed piezoelectric film, and is contained at a rate so that each metal atom satisfies a desired metal atom ratio. Specifically, the composition contains the PZT-based precursors so that the metal atom ratio (Pb:Ce:Zr:Ti) in the composition satisfies (1.00 to 1.28):(0.005 to 0.05):(0.40 to 0.55):(0.60 to 0.45) and the total of metal atom ratio of Zr and Ti is 1. Accordingly, the composition is represented by a general formula $Pb_zCe_xZr_yTi_{1-y}O_3$ and a piezoelectric film in which x, y, z in the general formula satisfy a relationship of $0.005 \leq x \leq 0.05$, a relationship of $0.40 \leq y \leq 0.55$, and a relationship of $0.95 \leq z \leq 1.15$ can be formed. Here, the metal atom ratio of Ce in the composition is controlled so as to fall in the range described above, because, when the metal atom ratio of Ce in the composition is less than the lower limit value, x in the general formula showing the film composition after the film is formed is less than the lower limit value, and a piezoelectric constant of a piezoelectric film may not be sufficiently improved. On the other hand, when the metal atom ratio of Ce in the composition exceeds the upper limit value, x in the general formula showing the film composition after the film is formed exceeds the upper limit value and cracks are easily generated on a piezoelectric film. The metal atom ratio of Zr and Ti in the composition are controlled so as to fall in the range described above, because, when the metal atom ratio of Zr and Ti in the composition are beyond the range described above, y in the general formula showing the film composition after the film is formed is beyond the desired range described above and a piezoelectric constant of a piezoelectric film may not be sufficiently improved. The metal atom ratio of Pb in the composition is controlled so as to fall in the range described above, because, when the metal atom ratio of Pb in the composition is less than the lower limit value, z in the general formula showing the film composition after the film is formed is less than the lower limit value, a large amount of pyrochlore phases is contained in the film and electrical properties such as piezoelectric properties are significantly deteriorated. In contrast, when the metal atom ratio of Pb in the composition is greater than the upper limit value of the range described above, z in the general formula showing the film composition after the film is formed is greater than the upper limit value, a large amount of PbO remains in the sintered film and electrical reliability of the film is deteriorated due to an increase in leakage current. That is, an excessive amount of lead easily remains in the film and leakage properties or insulating properties are deteriorated. It is preferable that the metal atom ratio (Pb:Ce:Zr:Ti) in the composition satisfy (1.05 to 1.15):(0.01 to 0.03):(0.45 to 0.55):(0.45 to 0.55) in the range described above and the total of metal atom ratio of Zr and Ti in a metal atom ratio be 1.

As a PZT-based precursor, a compound in which organic groups are bonded with each metal atom such as Pb, Ce, Zr, and Ti through oxygen or nitrogen atoms thereof is preferably used as each metal source (Pb source, Ce source, Zr, source, and Ti source). For example, one kind or two or more kinds selected from the group consisting of metal alkoxides, a metal diol complex, a metal triol complex, metal carboxylate, a metal β-diketonate complex, a metal β-diketoester complex, a metal β-iminoketo complex, and a metal amino complex are used. The particularly preferable compound is metal alkoxides, a partial hydrolyzate thereof, or an organic acid salt.

Specifically, examples of the Pb compound include acetic acid salt such as lead acetate: $Pb(OAc)_2$, or alkoxides such as lead diisopropoxide: $Pb(OiPr)_2$. Examples of the Ce compound include organic acid salt such as cerium 2-ethylhexanoate or cerium 2-ethylbutyrate, alkoxides such as cerium tri n-butoxide or cerium triethoxide, or a metal β-diketonate complex such as tris (acetylacetonate) cerium. Among these Ce compounds, cerium 2-ethylhexanoate and cerium triethoxide are more preferably used. Examples of the Ti compound include alkoxides such as titanium tetraethoxide: $Ti(OEt)_4$, titanium tetraisopropoxide: $Ti(OiPr)_4$, titanium tetra-n-butoxide: $Ti(OnBu)_4$, titanium tetraisobutoxide: $Ti(OiBu)_4$, titanium tetra t-butoxide: $Ti(OtBu)_4$, and titanium dimethoxy diisopropoxide: $Ti(OMe)_2(OiPr)_2$. Among these Ti compounds, titanium tetraisopropoxide and titanium tetra t-butoxide are more preferably used. In addition, preferable examples of the Zr compound include the same alkoxides as those of the Ti compounds, that is zirconium tetraethoxide: $Zr(OEt)_4$, zirconium tetraisopropoxide: $Zr(OiPr)_4$, zirconium tetra-n-butoxide: $Zr(OnBu)_4$, zirconium tetraisobutoxide: $Zr(OiBu)_4$, zirconium tetra t-butoxide: $Zr(OtBu)_4$, and zirconium-dimethoxy diisopropoxide: $Zr(OMe)_2(OiPr)_2$. Among these Zr compounds, zirconium tetra-n-butoxide and zirconium tetraisopropoxide are more preferably used. The metal alkoxide may be used as it is, but a partial hydrolyzate thereof may be used in order to promote decomposition.

The concentration of the Ce-doped PZT-based precursor in 100 mass % of the composition is set to be from 17 mass % to 35 mass % in terms of an oxide concentration, because when the concentration thereof is less than the lower limit value, a sufficient film thickness may not be obtained, and on the other hand, when the concentration thereof is greater than the upper limit value, cracks are easily generated. The concentration of the Ce-doped PZT-based precursor in 100 mass % of the composition is preferably from 20 mass % to 25 mass % in terms of an oxide concentration. The oxide concentration of the concentration of the Ce-doped PZT-based precursor in the composition is a concentration of metal oxides in 100 mass % of a composition which is calculated by assuming that all of the metal atoms contained in a composition are desired oxides.

A diol contained in the composition is a component which is a solvent of a composition. Specific examples of diols include propylene glycol, ethylene glycol, and 1,3-propanediol. Among these, propylene glycol or ethylene glycol is particularly preferable. When the diol is set as a compulsory solvent component, it is possible to increase storage stability of a composition.

The rate of the diols in 100 mass % of the composition is limited to 16 mass % to 56 mass %, because precipitates may be generated when the rate thereof is less than the lower limit value, and on the other hand, voids (micropores) are easily generated at the time of obtaining a thick film when the rate thereof exceeds the upper limit value. Among these, the rate of the diols is preferably from 28 mass % to 42 mass %.

Examples of other solvents include carboxylic acid, alcohol (for example, ethanol or 1-butanol, or polyalcohol other than diol), ester, ketones (for example, acetone or methyl ethyl ketone), ethers (for example, dimethyl ether or diethyl ether), cycloalkanes (for example, cyclohexane or cyclohexanol), aromatics (for example, benzene, toluene, or xylene), and other tetrahydrofurans, and a mixed solvent obtained by mixing one kind or two or more kinds of these to a diol can also be used.

Specifically, as the carboxylic acid, n-butyric acid, α-methyl butyrate, i-valeric acid, 2-ethylbutyrate, 2,2-dimethylbutyrate, 3,3-dimethylbutyrate, 2,3-dimethylbutyrate, 3-methylpentanoate, 4-methylpentanoate, 2-ethylpentanoate, 3-ethylpentanoate, 2,2-dimethylpentanoate, 3,3-dimethylpentanoate, 2,3-dimethylpentanoate, 2-ethylhexanoate, or 3-ethylhexanoate are preferably used.

As the ester, ethyl acetate, propyl acetate, n-butyl acetate, sec-butyl acetate, tert-butyl acetate, isobutyl acetate, n-amyl acetate, sec-amyl acetate, tert-amyl acetate, or isoamyl acetate is preferably used, and as alcohol, 1-propanol, 2-propanol, 1-butanol, 2-butanol, iso-butyl alcohol, 1-pentanol, 2-pentanol, 2-methyl-2-pentanol, or 2-methoxyethanol is preferably used.

In addition, the composition of the present invention contains polyvinylpyrrolidone (PVP) or polyethylene glycol, which is a polymer compound. Polyvinylpyrrolidone or polyethylene glycol is used for adjusting liquid viscosity in the composition. Particularly, polyvinylpyrrolidone is used for adjusting relative viscosity determined by using a k value. The k value here is a viscosity property value relating to a molecular weight, and is a value calculated by applying a relative viscosity value (25° C.) measured by using a capillary viscometer in the following Fikentscher's equation.

$$k \text{ value}=(1.5 \log \eta rel-1)/(0.15+0.003c)+(300c \log \eta rel+(c+1.5c \log \eta rel)^2)^{1/2}/(0.15c+0.003c^2)$$

In the equation, "ηrel" represents a relative viscosity of polyvinylpyrrolidone aqueous solution with respect to water and "c" represents a polyvinylpyrrolidone concentration (mass %) in the polyvinylpyrrolidone aqueous solution.

The k value of polyvinylpyrrolidone contained in the composition of the present invention is preferably from 30 to 90. In order to form a thick piezoelectric film, it is necessary to have sufficient viscosity in order that a coated film (gel film) maintain a thickness thereof at the time of coating a substrate or the like with a composition, but, when the k value is less than the lower limit value, sufficient viscosity is hardly obtained. On the other hand, when the k value exceeds the upper limit value, viscosity became excessively high and the composition is difficult to be uniformly applied. In a case of using polyethylene glycol, polyethylene glycol having a degree of polymerization of 200 to 400 is preferably used. When the degree of polymerization thereof is lower than the lower limit value, sufficient viscosity is hardly obtained. On the other hand, when the degree of polymerization is greater than the upper limit value, viscosity becomes excessively high and the composition is difficult to be uniformly applied. Polyvinylpyrrolidone is particularly preferable, because the crack prevention effect is great.

A molar ratio of polyvinylpyrrolidone or polyethylene glycol to 1 mole of the Ce-doped PZT-based precursor is set so as to obtain 0.01 moles to 0.25 moles in terms of monomers, because, when the molar ratio thereof is less than the lower limit value, cracks are easily generated. On the other hand, when the molar ratio thereof exceeds the upper limit value, voids are easily generated. Among these, the molar ratio of polyvinylpyrrolidone or polyethylene glycol to 1 mole of the Ce-doped PZT-based precursor is preferably set so as to obtain 0.025 moles to 0.075 moles in terms of monomers. Polyvinylpyrrolidone (PVP) or polyethylene glycol has a high decomposition temperature and great affinity with the Ce-doped PZT-based precursor. Therefore, polyvinylpyrrolidone or polyethylene glycol is difficult to be removed from the film and easily causes generation of voids. Accordingly, the amount added is desirably as small as possible. In the composition of the present invention, the precursor is suitably subjected to hydrolysis and organic materials are easily removed from the film. Accordingly, the amount added can be reduced to a comparatively small amount.

Here, 1 mole of the Ce-doped PZT-based precursor indicates that the content of $Pb_zCe_xZr_yTi_{1-y}O_3$ contained in the precursor is 1 mole.

In addition, a value in terms of monomer is a value obtained by converting a molecular weight of a monomer using the molecular weight of the monomer configuring a polymer as a reference (1 mole).

When linear monoalcohol is contained in the composition of the present invention at a predetermined rate, a gel film which can effectively release organic materials to the outside of the film can be formed at the time of calcination. As a result, a dense and high-performance Ce-doped PZT-based piezoelectric film is obtained, even when the film thickness exceeds 100 nm. The number of carbon atoms of the linear monoalcohol is preferably from 6 to 12, because a boiling point is not sufficiently high and the film may not be sufficiently densified when the number of carbon atoms is less than the lower limit value. When the number of carbon atoms exceeds the upper limit value, the film can be densified, but solubility to a sol-gel solution is low, it is difficult to dissolve a sufficient amount of the linear monoalcohol, and viscosity of the solution excessively increases. Thus, uniform coating may not be performed due to generation of striation (stria or stripe). The number of carbons of the linear monoalcohol is more preferably from 7 to 9. The rate of the linear monoalcohol in 100 mass % of the composition is set to be from 0.6 mass % to 10 mass %, because, when the rate thereof is lower than the lower limit value, a sufficient clearance is not obtained in the film and organic materials in the film cannot be effectively removed during the process. Thus, the film may not be sufficiently densified. On the other hand, when the rate thereof exceeds the upper limit value, the drying of the film is delayed and a certain period of time is taken until the drying is completed. Thus, the film thickness may become thin. The rate of the linear monoalcohol in 100 mass % of the composition is more preferably from 1 mass % to 3 mass %. In addition, linear monoalcohol having 6 carbon atoms is 1-hexanol, linear monoalcohol having 7 carbon atoms is 1-heptanol, linear monoalcohol having 8 carbon atoms is 1-octanol, and linear monoalcohol having 9 carbon atoms is 1-nonanol. Further, linear monoalcohol having 10 carbon atoms is 1-decanol, linear monoalcohol having 11 carbon atoms is 1-undecanol, and linear monoalcohol having 12 carbon atoms is 1-dodecanol.

In addition to the components described above, as a stabilizer, if necessary, β-diketones (for example, acetylacetone, heptafluoro butanoylpivaloyl methane, dipivaloylmethane, trifluoroacetylacetone, benzoyl acetone, and the like), β-ketone acids (for example, acetoacetic acid, propionyl acetate, benzoyl acetate, and the like), β-ketoesters (for example, lower alkylesters such as methyl, propyl, or butyl of the ketone acids described above), oxy acids (for example, lactic acid, glycolic acid, α-oxy butyrate, salicylic acid, and the like), lower alkylesters of the oxy acids, oxyketones (for example, diacetone alcohol, acetoin, and the like), diol, triol, higher carboxylic acid, alkanolamines (for example, diethanolamine, triethanolamine, monoethanolamine, and the like), or polyamine may be added in an amount of approximately 0.2 to 3 in terms of a value of (molecular number of stabilizer)/(metal atom number). Among these, acetylacetone of β-diketones is preferable as the stabilizer.

Next, a manufacturing method of the composition for forming a Ce-doped PZT-based piezoelectric film of the present invention will be described. First, the PZT-based precursors such as the Pb compound and the like described above are prepared and these are weighed to have a rate so as to have the desired metal atom ratio described above. The weighed PZT-based precursor described above and a diol are put into a reaction vessel and mixed with each other, and refluxed and reacted with each other preferably in a nitrogen atmosphere at a temperature of 130° C. to 175° C. for 0.5 hours to 3 hours, and thus, synthetic liquid is prepared. After refluxing, it is preferable to perform desolventizing by using a method of atmospheric distillation or vacuum distillation. In a case of adding the stabilizer such as acetylacetone, it is preferable to add these to the synthetic liquid after the desolventizing, and perform refluxing in the nitrogen atmosphere at a temperature of 130° C. to 175° C. for 0.5 hours to 5 hours. After that, the synthetic liquid is cooled to room temperature (approximately 25° C.) by performing natural cooling at room temperature.

The linear monoalcohol is added to the cooled synthetic liquid to prepare a sol-gel solution. At this time, the concentration of the PZT-based precursor in 100 mass % of the composition is adjusted to be 17 mass % to 35 mass % in terms of an oxide concentration and the rate of diol is adjusted to be 16 mass % to 56 mass %. In addition, a solvent other than diol is preferably added to the sol-gel solution. Then, the sol-gel solution is refluxed again in a predetermined atmosphere, for example, a nitrogen atmosphere at a temperature of 100° C. to 175° C. for 0.5 hours to 10 hours. In a case of adding an organic dopant containing a polar solvent such as a formamide-based solution, the organic dopant is preferably added together with a solvent other than diol (alcohol or the like).

polyvinylpyrrolidone or polyethylene glycol in which a molar ratio of the polyvinylpyrrolidone or the polyethylene glycol to 1 mole of the PZT-based precursor satisfies 0.01 moles to 0.25 moles in terms of monomers is added to the sol-gel solution, and the polyvinylpyrrolidone or polyethylene glycol is stirred to be evenly dispersed in the sol-gel solution. Accordingly, a composition for forming the Ce-doped PZT-based piezoelectric film of the present invention is obtained.

After preparing the composition, particles are removed by performing a filtering process or the like, and the number of particles having a particle size equal to or greater than 0.5 µm (particularly, equal to or greater than 0.3 and more particularly, equal to or greater than 0.2 µm) is preferably equal to or less than 50 per 1 milliliter of the composition.

When the number of particles in the composition having a particle size equal to or greater than 0.5 µm exceeds 50 per 1 milliliter of the composition, long-term storage stability is deteriorated. It is preferable that the number of particles in the composition having a particle size equal to or greater than 0.5 µm be as small as possible, and it is particularly preferable that the number thereof be equal to or smaller than 30 per 1 milliliter of the composition.

A state where the particles having a particle size equal to or greater than 0.2 µm in the composition are removed by performing a filtering process or the like is preferable. A light-scattering type particle counter is used in the measurement of the number of particles in the composition.

A method of processing the composition in which the number of particles has been adjusted to be in the range described above is not particularly limited, and the following methods are used, for example. A first method is a filtering method of performing a force-feed with a syringe by using a commercially available membrane filter having a hole diameter of 0.2 µm. A second method is a pressure-filtering method performed by combining a commercially available membrane filter having a hole diameter of 0.05 µm and a pressure tank with each other. A third method is a circulating and filtering method performed by combining the filter used in the second method and a liquid circulating bath with each other.

In any methods, particle capture rates obtained by using a filter are different depending on force-feed pressure of the composition. It is generally known that, as the pressure is reduced, the capture rate increases. Particularly, in the first method or the second method, it is preferable that the composition be caused to extremely slowly pass through the filter at low pressure in order to realize the condition in which the number of particles having a particle size equal to or greater than 0.5 µm be equal to or smaller than 50 per 1 milliliter of the composition.

Next, a method of forming the Ce-doped PZT-based piezoelectric film of the present invention will be described. This is a method of forming a piezoelectric film by using a sol-gel method and the composition for forming a Ce-doped PZT-based piezoelectric film of the present invention is used as a raw material solution.

First, the composition for forming a Ce-doped PZT-based piezoelectric film described above is coated on a substrate and a coated film (gel film) having a predetermined thickness is formed. The coating method is not particularly limited, and spin coating, dip coating, a liquid source misted chemical deposition (LSMCD) method, or an electrostatic spray method is used. As the substrate where a piezoelectric film is formed, a silicon substrate where a lower electrode is formed or a heat-resistant substrate such as a sapphire substrate is used. A lower electrode formed on a substrate is formed by using a material having conductivity and not reacting with a piezoelectric film, such as Pt, $TiO_x$, Ir, or Ru. For example, the lower electrode can have a double-layered structure of a $TiO_x$ film and a Pt film, in this order, from the substrate side. As a specific example of the $TiO_x$ film, a $TiO_2$ film is used. In a case of using a silicon substrate as a substrate, a $SiO_2$ film can be formed on a surface of this substrate.

After forming a coating film on a substrate, the coating film is calcinated, and then the coating film is crystallized by sintering. The calcination is performed under predetermined conditions by using a hot plate or a rapid heating process (RTA). The calcination is performed in order to remove a solvent and convert the metal compound into a composite oxide by pyrolysis or hydrolysis, and therefore, the calcination is desirably performed in air, in an oxidation atmosphere, or in an atmosphere containing water vapor. Even when the heating is performed in the air, moisture necessary for hydrolysis is sufficiently ensured by moisture in the air. Since a low-boiling-point solvent or absorbed water molecules are particularly removed before the calcinations, low-temperature heating may be performed by using a hot plate at a temperature of 70° C. to 90° C. for 0.5 minutes to 5 minutes.

Figure 1:
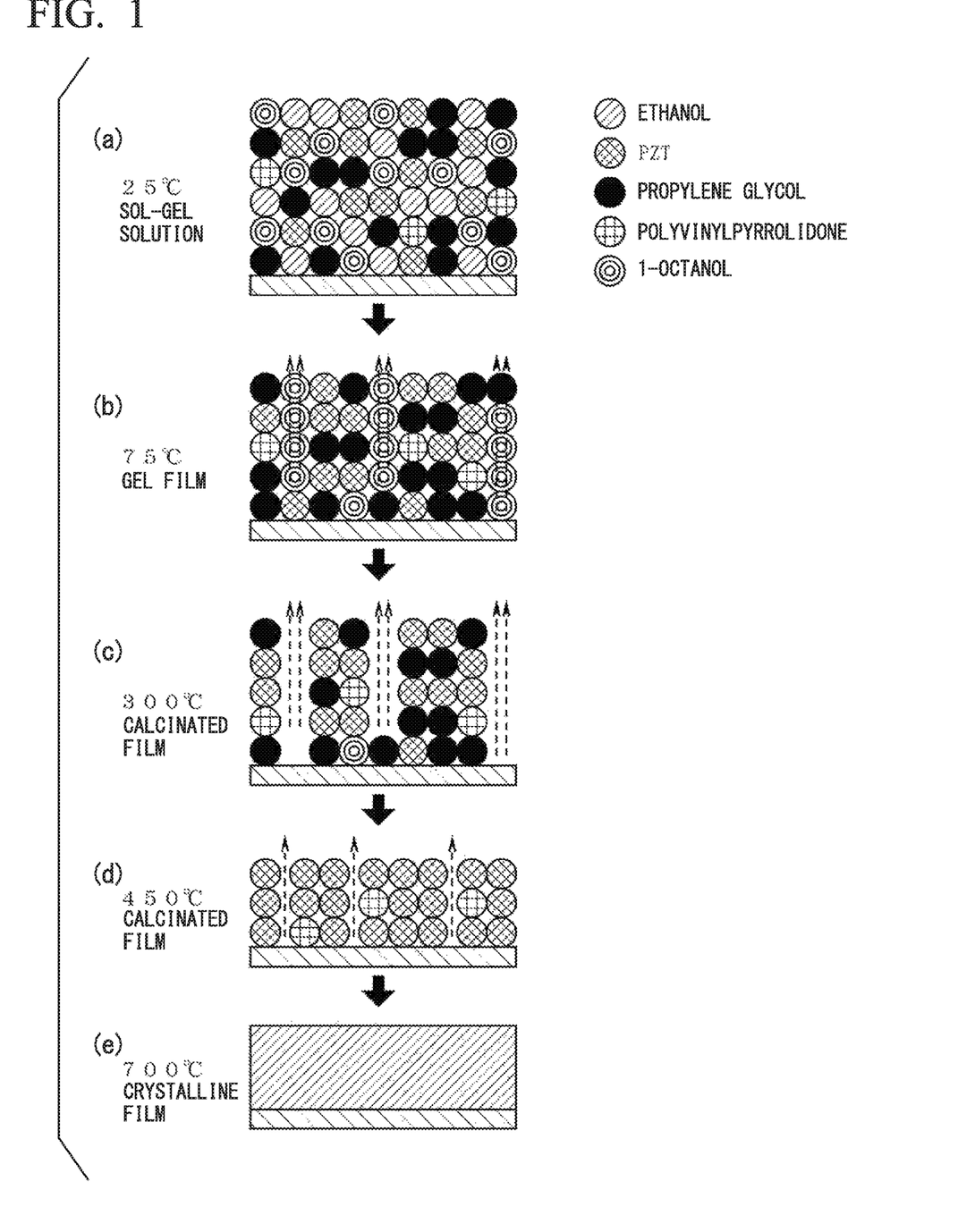
FIG. 1 is a schematic view showing a mechanism in which voids are not generated when a film is formed by using a solution of a composition for forming a Ce-doped PZT-based piezoelectric film of the embodiment of the present invention.

It is preferable to perform the calcination by performing two-stage calcination by changing a rate of temperature rise and a heating holding temperature in order to sufficiently remove a solvent or the like to further increase an effect of preventing voids or cracks or in order to promote densifying of a film structure. In a case of performing the two-stage calcination, a first stage is calcination in which the temperature is held at 250° C. to 300° C. for 3 minutes to 10 minutes, and a second stage is calcination in which the temperature is held at 400° C. to 500° C. for 3 minutes to 10 minutes. As shown in FIG. 1(a) to FIG. 1(d), a model in which liquid in a gel film rises to the vicinity of the surface due to a capillary force and the gel is dried is provided, from research of Scherer et. al. That is, since a linear monoalcohol having 6 to 12 carbon atoms (for example, 1-octanol having 8 carbon atoms) having great surface tension, low affinity with the PZT-based precursors, and low vapor pressure is added to the sol-gel solution which is the composition of the present invention (FIG. 1(a)), the temperature slowly increases from room temperature to the calcination temperature in the first stage (for example, at a rate of temperature rise of 2.5° C./sec to 10° C./sec). Therefore, 1-octanol rises to the surface of the gel film and is evaporated due to a capillary force (FIG. 1(b)), and suitable clearances are formed (FIG. 1(c)). Then, since the temperature comparatively rapidly increases from the calcination temperature in the first stage to the calcination temperature in the second stage (for example, at a rate of temperature rise of 50° C./sec to 100° C./sec), propylene glycol or polyvinylpyrrolidone is gasified and rapidly evaporated through the clearances. Thus, diamond-like carbon obtained by carbonization of propylene glycol is not generated in the inner portion and a dense calcinated film without diamond-like carbon therein is obtained (FIG. 1(d)). As a result, after sintering, a dense crystalline film without voids therein is obtained (FIG. 1(e)).

Figure 2:
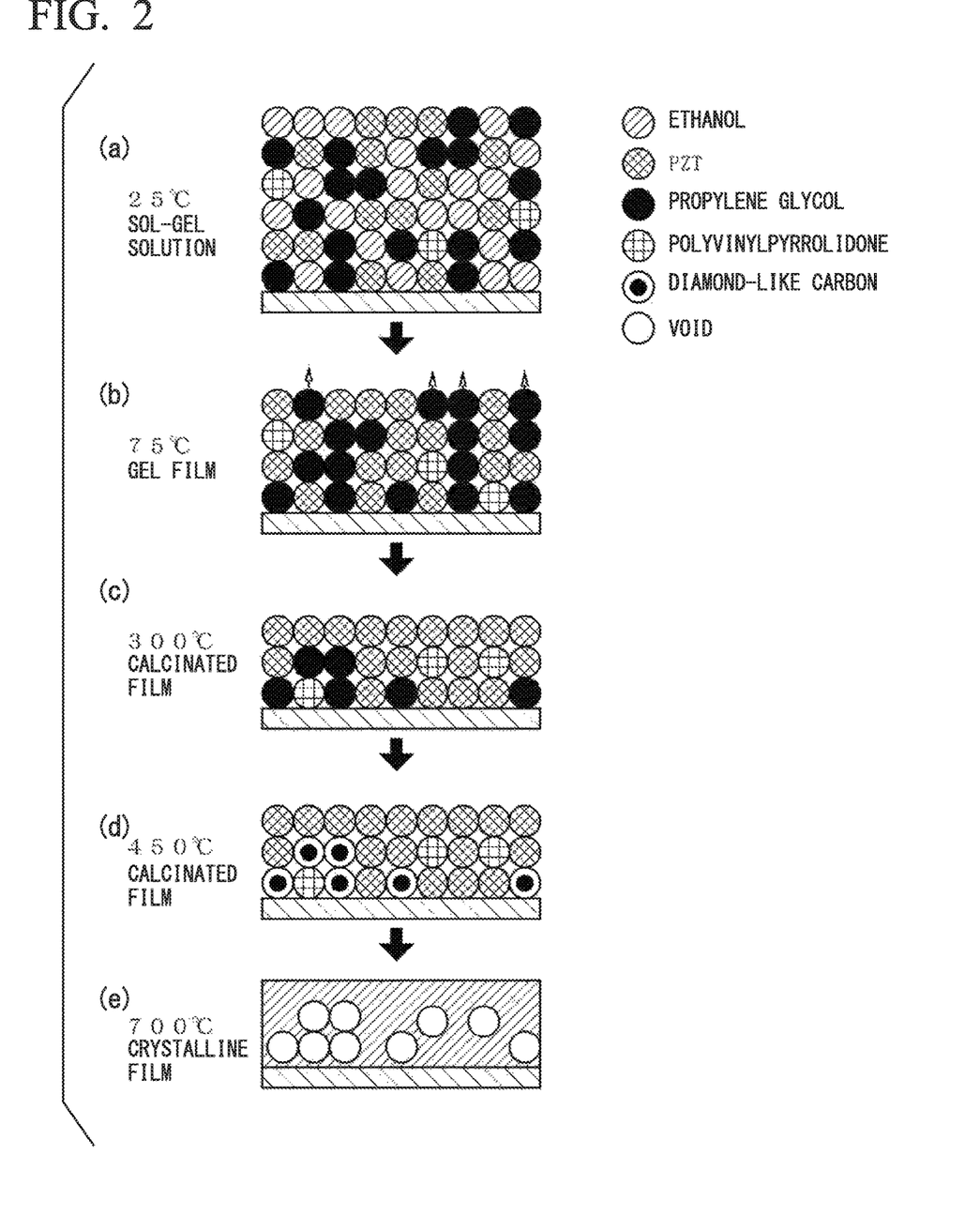
FIG. 2 is a schematic view showing a mechanism in which voids are generated when a film is formed by using a solution of a composition for forming a PZT-based piezoelectric film of an example of the related art.

With respect to the calcination of the present invention, in the related art, as shown in FIG. 2(a) to FIG. 2(d), even when the temperature slowly increases from room temperature to the calcination temperature in the first stage, a solvent such as 1-octanol which rises to the surface of the gel film and is evaporated due to a capillary force does not exist (FIG. 2(a)), and thus, clearances are not formed in the calcinated film. In addition, even when propylene glycol in the vicinity of the surface of the gel film or the calcinated film is evaporated, gas may not be removed due to rearrangement of particles (FIG. 2(b) and FIG. 2(c)). Accordingly, when the temperature comparatively rapidly increases from the calcination temperature in the first stage to the calcination temperature in the second stage, propylene glycol therein is carbonized to generate diamond-like carbon in the calcinated film (FIG. 2(d)). The diamond-like carbon is a reason for the generation of voids (FIG. 2(e)) in a crystalline film after sintering.

Here, the calcination temperature in the first stage is limited to be in a range of 250° C. to 300° C., because pyrolysis of a precursor is insufficient and cracks are easily generated when the calcination temperature is lower than the lower limit value. On the other hand, when the calcination temperature exceeds the upper limit value, the precursor material on the upper portion of the substrate is decomposed before the precursor material in the vicinity of the substrate is completely decomposed, the organic materials remain around the substrate of the film, and the voids are easily generated. The calcination time in the first stage is limited to be in a range of 3 minutes to 10 minutes, because the decomposition of the precursor material does not sufficiently proceed when the calcination time is shorter than the lower limit value. On the other hand, when the calcination time exceeds the upper limit value, the process time is increased and productivity may be decreased. The calcination temperature in the second stage is limited to be in a range of 400° C. to 450° C. because residual organic materials remaining in the precursor material are not completely removed and the film may not be sufficiently densified when the calcination temperature is lower than the lower limit value. On the other hand, when the calcination temperature exceeds the upper limit value, it may be difficult to control orientation properties due to the promotion of crystallization. The calcination time in the second stage is limited to be in a range of 3 minutes to 10 minutes because the residual organic materials are not sufficiently removed, and peeling or cracks of the film may be easily generated due to generation of strong stress at the time of crystallization when the calcination time is shorter than the lower limit value. On the other hand, when the calcination time exceeds the upper limit value, the process time is increased and productivity may be decreased.

In a step from the application of the composition to the calcination, sintering can be finally collectively performed by repeating a plurality of steps up to the calcination, so as to have a desired film thickness. In this forming method, the composition of the present invention is used as the raw material solution. Therefore, a thick film having a thickness of approximately several hundreds of nm can be formed by single coating step. Thus, the number of steps to be repeated described above can be decreased.

The sintering is a step of sintering the coating film after the calcination at a temperature equal to or higher than a crystallization temperature to perform crystallization, and a piezoelectric film is obtained by performing this step. As a sintering atmosphere of this crystallization step, $O_2$, $N_2$, Ar, $N_2O$, or $H_2$, or mixed gas thereof is suitable. The sintering is performed at 600° C. to 700° C. for approximately 1 minute to 5 minutes. The sintering may be performed by using a rapid heating process (RTA). In a case of performing the sintering by using a rapid heating process (RTA), a rate of temperature rise thereof is preferably from 2.5° C./sec to 100° C./sec.

Figure 3:
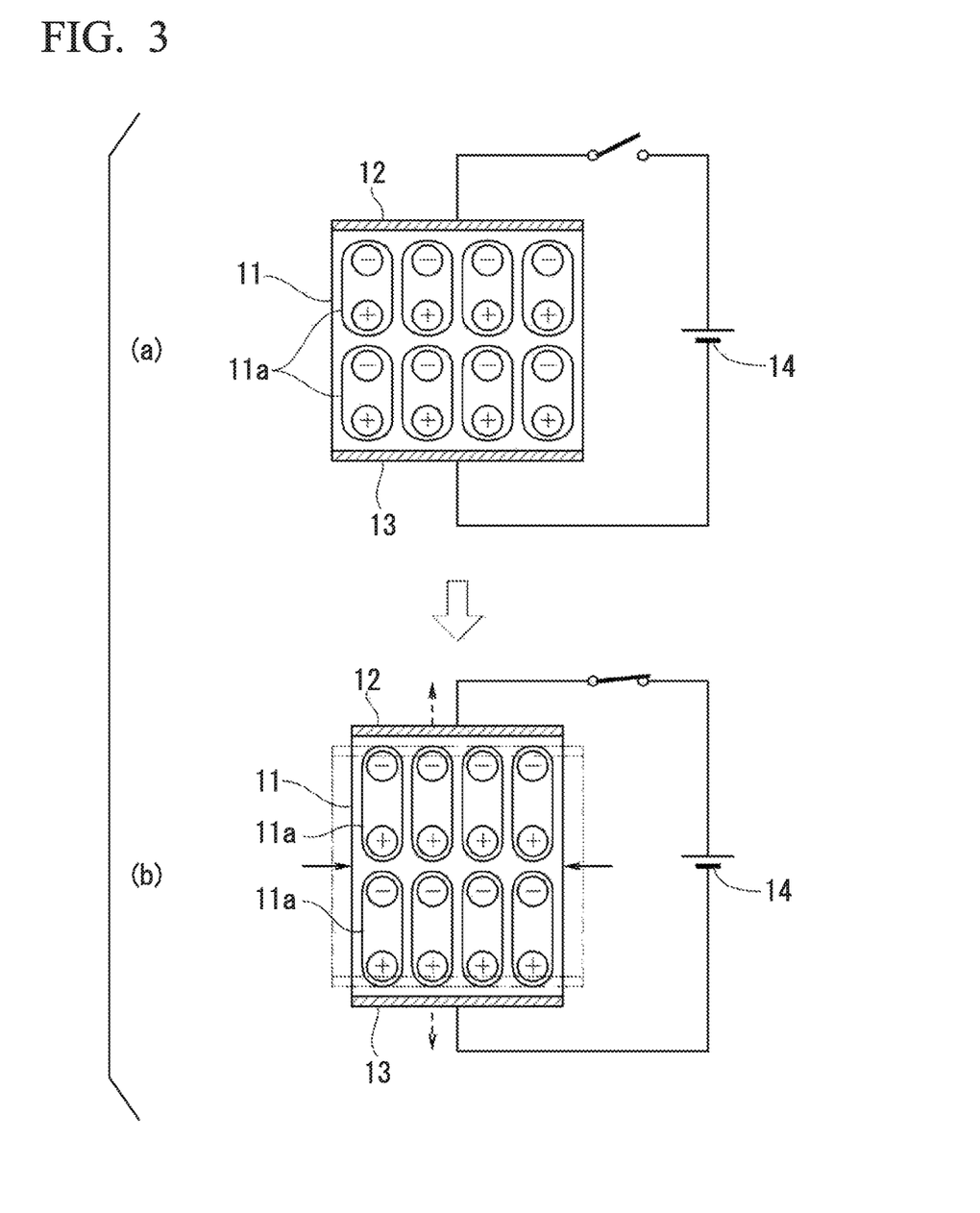
FIG. 3 is a schematic view showing behaviors of a piezoelectric film when a voltage is applied to a piezoelectric film manufactured by using the composition for forming a Ce-doped PZT-based piezoelectric film of the embodiment of the present invention.
Figure 4:
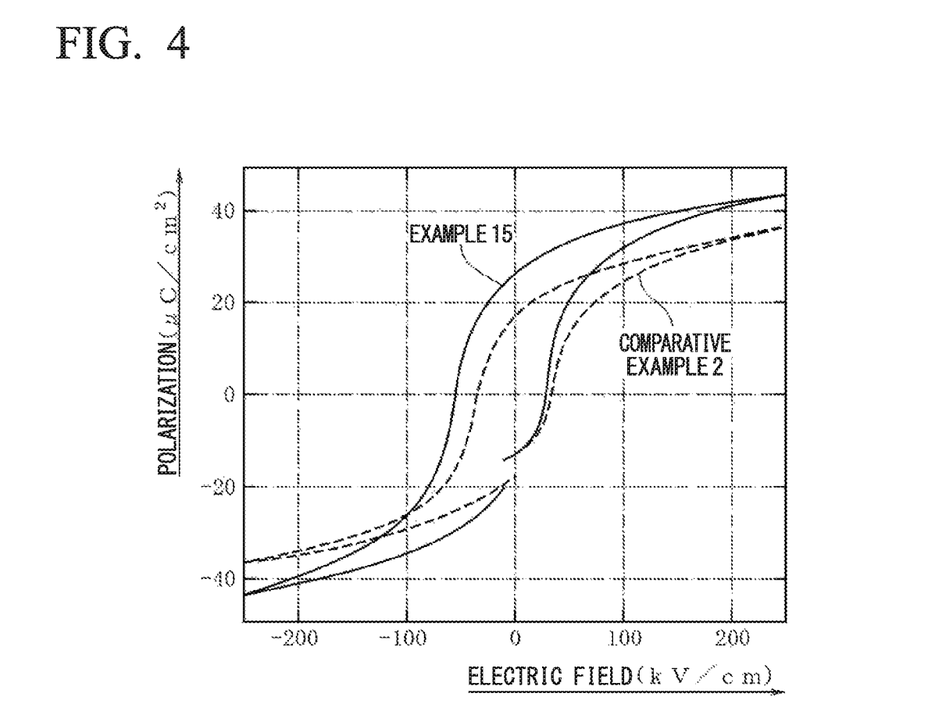
FIG. 4 is a diagram showing hysteresis curves of piezoelectric films of Example 15 and Comparative Example 2.

By performing the steps described above, the Ce-doped PZT-based piezoelectric film is obtained. It is possible to improve a piezoelectric constant of this piezoelectric film by performing doping with Ce, and thus, it is possible to obtain greater displacement and to decrease a dielectric constant. Accordingly, in a case of using this piezoelectric film as a sensor, the advantages are increased. This may be because the domain (segregations having aligned crystal orientation, that is, regions having the same inner electric field direction in grain) is hardly moved by performing the doping with Ce. As shown in FIG. 4, a hysteresis curve is greatly shifted to a negative side and polarization directions are aligned to the substrate side immediately after the film is formed. Accordingly, a polarization process after the film is formed is not necessary. Although this piezoelectric film is a thick film comparatively simply obtained with a small number of steps at the time of forming the film, cracks are extremely slight and a dense film structure is obtained, and thus, electric properties are extremely good. Accordingly, the Ce-doped PZT-based piezoelectric film obtained by using the method of the present invention can be suitably used as a configuration material (electrode) of a composite electronic component such as a piezoelectric element, an IPD, or a pyroelectric element. In FIG. 3, a piezoelectric film having a property of elongating in a direction where the voltage is applied is used, but a piezoelectric film having a property of elongating in a direction orthogonal to a direction where the voltage is applied may be used.

EXAMPLES

Next, examples and comparative examples of the present invention will be described in detail.

Example 1

First, lead acetate trihydrate (Pb source) and propylene glycol (diol) were put into a reaction vessel and refluxed in a nitrogen atmosphere at a temperature of 150° C. for 1 hour, and cerium 2-ethylhexanoate (Ce source), zirconium tetrabutoxide (Zr source), titanium tetraisopropoxide (Ti source), and acetylacetone (stabilizer) were further added to the reaction vessel and refluxed and reacted with each other in the nitrogen atmosphere at a temperature of 150° C. for 1 hour to prepare synthesis liquid. Here, lead acetate trihydrate (Pb source), cerium 2-ethylhexanoate (Ce source), zirconium tetrabutoxide (Zr source), and titanium tetraisopropoxide (Ti source) were weighed so that a metal atom ratio (Pb:Ce:Zr:Ti) of the Ce-doped PZT-based precursor became 1.15:0.005:0.40:0.60. In addition, propylene glycol (diol) was added to have 7 moles (37 mass %) with respect to 1 mole of the Ce-doped PZT-based precursor, and acetylacetone (stabilizer) was added to have 2 moles with respect to 1 mole of the Ce-doped PZT-based precursor. Then, unnecessary solvent was removed by performing vacuum distillation, so that a concentration of the Ce-doped PZT-based precursor in 100 mass % of the synthesis liquid was 35 mass % in terms of an oxide concentration. Here, the oxide concentration of the concentration of the Ce-doped PZT-based precursor in the synthesis liquid was a concentration of metal oxides in 100 mass % of the synthesis liquid which was calculated by assuming that all of the metal atoms contained in the synthesis liquid were desired oxides.

Then, the synthetic liquid was cooled to 25° C. by performing natural cooling at room temperature. 1-Octanol (linear monoalcohol having 8 carbon atoms) and ethanol (solvent) were added to the synthesis liquid to obtain a sol-gel solution in which a concentration of the Ce-based PZT-based precursor in 100 mass % of a sol-gel liquid was 25 mass % in terms of an oxide concentration. That is, 1-octanol (linear monoalcohol having 8 carbon atoms) and ethanol (solvent) were added to the synthesis liquid until the desired concentration was obtained. Here, the oxide concentration of the concentration of the Ce-doped PZT-based precursor in the sol-gel solution was a concentration of metal oxides in 100 mass % of the sol-gel solution which was calculated by assuming that all of the metal atoms contained in the sol-gel solution were desired oxides.

Then, polyvinylpyrrolidone (PVP: k value=30) was added to the sol-gel solution so as to obtain 0.02 moles with respect to 1 mole of the Ce-doped PZT-based precursor, and stirred at room temperature (25° C.) for 24 hours to obtain a composition for forming a Ce-doped PZT-based piezoelectric film. This composition was force-feeded and filtered with a syringe by using a commercially available membrane filter having a hole diameter of 0.05 μm, and accordingly, the number of particles having a particle size equal to or greater than 0.5 μm was 1 per 1 milliliter of the solution. The concentration of the PZT-based precursor in 100 mass % of the composition was 25 mass % in terms of an oxide concentration. In addition, 4 mass % of 1-octanol (linear monoalcohol having 8 carbon atoms) was contained in 100 mass % of the composition. Further, 30 mass % of propylene glycol (diol) was contained in 100 mass % of the composition.

A silicon substrate, in which a $SiO_2$ film, a $TiO_2$ film, and a Pt film were formed and laminated from the bottom to the top in this order, set on a spin coater. The obtained composition was added dropwise from the top of the Pt film (lower electrode) which was an uppermost layer of the silicon substrate, and spin coating was performed at a rotation rate of 1800 rpm for 60 seconds, and accordingly, a coated film (gel film) was formed on the Pt film (lower electrode). A silicon substrate where this coated film (gel film) was formed was heated and held (dried) at a temperature of 75° C. for 1 minute by using a hot plate to remove a low-boiling-point solvent or water. After that, the gel film was heated and decomposed by heating and holding (calcination in a first stage) the substrate using a hot plate at 300° C. for 5 minutes, and organic materials or absorbed water remaining in the gel film were removed by heating and holding (calcination in a second stage) using a hot plate at 450° C. for 5 minutes. By doing so, a calcinated film (Ce-doped PZT amorphous film) having a thickness of 200 nm was obtained. A calcinated film having a thickness of 400 nm was obtained by repeating the same operation as described above twice. A silicon substrate where the calcinated film having a thickness of 400 nm was formed was sintered by holding the silicon substrate in the oxygen atmosphere at 700° C. for 1 minute by using a rapid heating process (RTA). A rate of temperature rise at this time was 10° C./sec. By doing so, a Ce-doped PZT-based piezoelectric film having a thickness of 400 nm was formed on the Pt film (lower electrode). As the film thickness of the piezoelectric film, a thickness (total thickness) of a cross-section of the piezoelectric film was measured with SEM (S4300 manufactured by Hitachi, Ltd.). The metal atom ratio (Pb:Ce:Zr:Ti) of the PZT-based precursor was 1.15:0.005:0.40:0.60, but some Pb may have been evaporated and removed by performing sintering, and the metal atom ratio (Pb:Ce:Zr:Ti) of the sintered PZT-based piezoelectric film became 1.01:0.005:0.40:0.60 and was represented by a general formula: $Pb_{1.01}Ce_{0.005}Zr_{0.40}Ti_{0.60}O_3$. In addition, a (100) plane orientation degree of the sintered PZT-based piezoelectric film was 90%.

Example 2

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.005:0.50:0.50. The metal atom ratio (Pb:Ce:Zr:Ti) of the PZT-based precursor was 1.15:0.005:0.50:0.50, but some Pb may have been evaporated and removed by performing sintering, and the metal atom ratio (Pb:Ce:Zr:Ti) of the sintered PZT-based piezoelectric film became 1.01:0.005:0.50:0.50 and was represented by a general formula: $Pb_{1.01}Ce_{0.005}Zr_{0.50}Ti_{0.50}O_3$. In addition, a (100) plane orientation degree of the sintered PZT-based piezoelectric film was 90%.

Example 3

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.005:0.52:0.48. The metal atom ratio (Pb:Ce:Zr:Ti) of the PZT-based precursor was 1.15:0.005:0.52:0.48, but some Pb may have been evaporated and removed by performing sintering, and the metal atom ratio (Pb:Ce:Zr:Ti) of the sintered PZT-based piezoelectric film became 1.01:0.005:0.52:0.48 and was represented by a general formula: $Pb_{1.01}Ce_{0.005}Zr_{0.52}Ti_{0.48}O_3$. In addition, a (100) plane orientation degree of the sintered PZT-based piezoelectric film was 91%.

Example 4

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.005:0.55:0.45. The metal atom ratio (Pb:Ce:Zr:Ti) of the PZT-based precursor was 1.15:0.005:0.55:0.45, but some Pb may have been evaporated and removed by performing sintering, and the metal atom ratio (Pb:Ce:Zr:Ti) of the sintered Ce-doped PZT-based piezoelectric film became 1.01:0.005:0.55:0.45 and was represented by a general formula: $Pb_{1.01}Ce_{0.005}Zr_{0.55}Ti_{0.45}O_3$. In addition, a (100) plane orientation degree of the sintered PZT-based piezoelectric film was 90%.

Example 5

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.01:0.40:0.60. The metal atom ratio (Pb:Ce:Zr:Ti) of the PZT-based precursor was 1.15:0.01:0.40:0.60, but some Pb may have been evaporated and removed by performing sintering, and the metal atom ratio (Pb:Ce:Zr:Ti) of the sintered Ce-doped PZT-based piezoelectric film became 1.01:0.01:0.40:0.60 and was represented by a general formula: $Pb_{1.01}Ce_{0.01}Zr_{0.40}Ti_{0.60}O_3$. In addition, a (100) plane orientation degree of the sintered PZT-based piezoelectric film was 88%.

Example 6

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.01:0.50:0.50. The metal atom ratio (Pb:Ce:Zr:Ti) of the PZT-based precursor was 1.15:0.01:0.50:0.50, but some Pb may have been evaporated and removed by performing sintering, and the metal atom ratio (Pb:Ce:Zr:Ti) of the sintered Ce-doped PZT-based piezoelectric film became 1.01:0.01:0.50:0.50 and was represented by a general formula: $Pb_{1.01}Ce_{0.01}Zr_{0.50}Ti_{0.50}O_3$. In addition, a (100) plane orientation degree of the sintered PZT-based piezoelectric film was 90%.

Example 7

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.01:0.52:0.48. The metal atom ratio (Pb:Ce:Zr:Ti) of the PZT-based precursor was 1.15:0.01:0.52:0.48, but some Pb may have been evaporated and removed by performing sintering, and the metal atom ratio (Pb:Ce:Zr:Ti) of the sintered Ce-doped PZT-based piezoelectric film became 1.01:0.01:0.52:0.48 and was represented by a general formula: $Pb_{1.01}Ce_{0.01}Zr_{0.52}Ti_{0.48}O_3$. In addition, a (100) plane orientation degree of the sintered PZT-based piezoelectric film was 90%.

Example 8

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.01:0.55:0.45. The metal atom ratio (Pb:Ce:Zr:Ti) of the PZT-based precursor was 1.15:0.01:0.55:0.45, but some Pb may have been evaporated and removed by performing sintering, and the metal atom ratio (Pb:Ce:Zr:Ti) of the sintered Ce-doped PZT-based piezoelectric film became 1.01:0.01:0.55:0.45 and was represented by a general formula: $Pb_{1.01}Ce_{0.01}Zr_{0.55}Ti_{0.45}O_3$. In addition, a (100) plane orientation degree of the sintered PZT-based piezoelectric film was 90%.

Example 9

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.03:0.40:0.60. The metal atom ratio (Pb:Ce:Zr:Ti) of the PZT-based precursor was 1.15:0.03:0.40:0.60, but some Pb may have been evaporated and removed by performing sintering, and the metal atom ratio (Pb:Ce:Zr:Ti) of the sintered Ce-doped PZT-based piezoelectric film became 1.03:0.03:0.40:0.60 and was represented by a general formula: $Pb_{1.03}Ce_{0.03}Zr_{0.40}Ti_{0.60}O_3$. In addition, a (100) plane orientation degree of the sintered PZT-based piezoelectric film was 90%.

Example 10

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.03:0.50:0.50. The metal atom ratio (Pb:Ce:Zr:Ti) of the PZT-based precursor was 1.15:0.03:0.50:0.50, but some Pb may have been evaporated and removed by performing sintering, and the metal atom ratio (Pb:Ce:Zr:Ti) of the sintered Ce-doped PZT-based piezoelectric film became 1.03:0.03:0.50:0.50 and was represented by a general formula: $Pb_{1.03}Ce_{0.03}Zr_{0.50}Ti_{o0.50}O_3$. In addition, a (100) plane orientation degree of the sintered PZT-based piezoelectric film was 90%.

Example 11

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.03:0.52:0.48. The metal atom ratio (Pb:Ce:Zr:Ti) of the PZT-based precursor was 1.15:0.03:0.52:0.48, but some Pb may have been evaporated and removed by performing sintering, and the metal atom ratio (Pb:Ce:Zr:Ti) of the sintered Ce-doped PZT-based piezoelectric film became 1.03:0.03:0.52:0.48 and was represented by a general formula: $Pb_{1.03}Ce_{0.03}Zr_{0.52}Ti_{0.48}O_3$. In addition, a (100) plane orientation degree of the sintered PZT-based piezoelectric film was 90%.

Example 12

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.03:0.55:0.45. The metal atom ratio (Pb:Ce:Zr:Ti) of the PZT-based precursor was 1.15:0.03:0.55:0.45, but some Pb may have been evaporated and removed by performing sintering, and the metal atom ratio (Pb:Ce:Zr:Ti) of the sintered Ce-doped PZT-based piezoelectric film became 1.03:0.03:0.55:0.45 and was represented by a general formula: $Pb_{1.03}Ce_{0.03}Zr_{0.55}Ti_{0.45}O_3$. In addition, a (100) plane orientation degree of the sintered PZT-based piezoelectric film was 90%.

Example 13

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.05:0.40:0.60. The metal atom ratio of the PZT-based precursor was 1.15:0.05:0.40:0.60, but some Pb may have been evaporated and removed by performing sintering, and the metal atom ratio (Pb:Ce:Zr:Ti) of the sintered Ce-doped PZT-based piezoelectric film became 1.04:0.05:0.40:0.60 and was represented by a general formula: $Pb_{1.04}Ce_{0.05}Zr_{0.40}Ti_{0.60}O_3$. In addition, a (100) plane orientation degree of the sintered PZT-based piezoelectric film was 87%.

Example 14

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.05:0.50:0.50. The metal atom ratio (Pb:Ce:Zr:Ti) of the PZT-based precursor was 1.15:0.05:0.50:0.50, but some Pb may have been evaporated and removed by performing sintering, and the metal atom ratio (Pb:Ce:Zr:Ti) of the sintered Ce-doped PZT-based piezoelectric film became 1.04:0.05:0.50:0.50 and was represented by a general formula: $Pb_{1.04}Ce_{0.05}Zr_{0.50}Ti_{0.50}O_3$. In addition, a (100) plane orientation degree of the sintered PZT-based piezoelectric film was 86%.

Example 15

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.05:0.52:0.48. The metal atom ratio (Pb:Ce:Zr:Ti) of the PZT-based precursor was 1.15:0.05:0.52:0.48, but some Pb may have been evaporated and removed by performing sintering, and the metal atom ratio (Pb:Ce:Zr:Ti) of the sintered Ce-doped PZT-based piezoelectric film became 1.04:0.05:0.52:0.48 and was represented by a general formula: $Pb_{1.04}Ce_{0.05}Zr_{0.52}Ti_{0.48}O_3$. In addition, a (100) plane orientation degree of the sintered PZT-based piezoelectric film was 88%.

Example 16

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.05:0.55:0.45. The metal atom ratio (Pb:Ce:Zr:Ti) of the PZT-based precursor was 1.15:0.05:0.55:0.45, but some Pb may have been evaporated and removed by performing sintering, and the metal atom ratio (Pb:Ce:Zr:Ti) of the sintered Ce-doped PZT-based piezoelectric film became 1.04:0.05:0.55:0.45 and was represented by a general formula: $Pb_{1.04}Ce_{0.05}Zr_{0.55}Ti_{0.45}O_3$. In addition, a (100) plane orientation degree of the sintered PZT-based piezoelectric film was 85%.

Example 17

A Ce-doped PZT-based piezoelectric film was formed in the same manner as in Example 5, except for setting a mixing molar ratio of polyvinylpyrrolidone (PVP) so as to have 0.01 mole to 1 mole of the Ce-doped PZT-based precursor. In addition, a (100) plane orientation degree of the sintered PZT-based piezoelectric film was 90%.

Example 18

A Ce-doped PZT-based piezoelectric film was formed in the same manner as in Example 5, except for setting a mixing molar ratio of polyvinylpyrrolidone (PVP) so as to have 0.025 mole to 1 mole of the Ce-doped PZT-based precursor. In addition, a (100) plane orientation degree of the sintered PZT-based piezoelectric film was 90%.

Example 19

A Ce-doped PZT-based piezoelectric film was formed in the same manner as in Example 5, except for setting a mixing molar ratio of polyvinylpyrrolidone (PVP) so as to have 0.075 mole to 1 mole of the Ce-doped PZT-based precursor. In addition, a (100) plane orientation degree of the sintered PZT-based piezoelectric film was 85%.

Example 20

A Ce-doped PZT-based piezoelectric film was formed in the same manner as in Example 5, except for setting a mixing molar ratio of polyvinylpyrrolidone (PVP) so as to have 0.25 mole to 1 mole of the Ce-doped PZT-based precursor. In addition, a (100) plane orientation degree of the sintered PZT-based piezoelectric film was 80%.

Example 21

A Ce-doped PZT-based piezoelectric film was formed in the same manner as in Example 5, except for setting a mixing rate of propylene glycol (diol) as 16 mass % with respect to 100 mass % of the composition. In addition, a (100) plane orientation degree of the sintered PZT-based piezoelectric film was 90%.

Example 22

A Ce-doped PZT-based piezoelectric film was formed in the same manner as in Example 5, except for setting a mixing rate of propylene glycol (diol) as 28 mass % with respect to 100 mass % of the composition. In addition, a (100) plane orientation degree of the sintered PZT-based piezoelectric film was 90%.

Example 23

A Ce-doped PZT-based piezoelectric film was formed in the same manner as in Example 5, except for setting a mixing rate of propylene glycol (diol) as 42 mass % with respect to 100 mass % of the composition. In addition, a (100) plane orientation degree of the sintered PZT-based piezoelectric film was 90%.

Example 24

A Ce-doped PZT-based piezoelectric film was formed in the same manner as in Example 5, except for setting a mixing rate of propylene glycol (diol) as 56 mass % with respect to 100 mass % of the composition. In addition, a (100) plane orientation degree of the sintered PZT-based piezoelectric film was 87%.

Example 25

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.00:0.03:0.52:0.48, setting a mixing molar ratio of polyvinylpyrrolidone (PVP) so as to have 0.05 mole to 1 mole of the Ce-doped PZT-based precursor, and setting a mixing rate of propylene glycol (diol) as 30 mass % with respect to 100 mass % of the composition. The metal atom ratio (Pb:Ce:Zr:Ti) of the PZT-based precursor was 1.00:0.03:0.52:0.48, but some Pb may have been evaporated and removed by performing sintering, and the metal atom ratio (Pb:Ce:Zr:Ti) of the sintered Ce-doped PZT-based piezoelectric film became 0.95:0.03:0.52:0.48 and was represented by a general formula: $Pb_{0.95}Ce_{0.03}Zr_{0.52}Ti_{0.48}O_3$. In addition, a (100) plane orientation degree of the sintered PZT-based piezoelectric film was 89%.

Example 26

A Ce-doped PZT-based piezoelectric film was formed in the same manner as in Example 25, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.05:0.03:0.52:0.48. The metal atom ratio (Pb:Ce:Zr:Ti) of the PZT-based precursor was 1.05:0.03:0.52:0.48, but some Pb may have been evaporated and removed by performing sintering, and the metal atom ratio (Pb:Ce:Zr:Ti) of the sintered Ce-doped PZT-based piezoelectric film became 0.99:0.03:0.52:0.48 and was represented by a general formula: $Pb_{0.99}Ce_{0.03}Zr_{0.52}Ti_{0.48}O_3$. In addition, a (100) plane orientation degree of the sintered PZT-based piezoelectric film was 88%.

Example 27

A Ce-doped PZT-based piezoelectric film was formed in the same manner as in Example 25, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.03:0.52:0.48. The metal atom ratio (Pb:Ce:Zr:Ti) of the PZT-based precursor was 1.15:0.03:0.52:0.48, but some Pb may have been evaporated and removed by performing sintering, and the metal atom ratio (Pb:Ce:Zr:Ti) of the sintered Ce-doped PZT-based piezoelectric film became 1.01:0.03:0.52:0.48 and was represented by a general formula: $Pb_{1.01}Ce_{0.03}Zr_{0.52}Ti_{0.48}O_3$. In addition, a (100) plane orientation degree of the sintered PZT-based piezoelectric film was 88%.

Example 28

A Ce-doped PZT-based piezoelectric film was formed in the same manner as in Example 25, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.28:0.03:0.52:0.48. The metal atom ratio (Pb:Ce:Zr:Ti) of the PZT-based precursor was 1.28:0.03:0.52:0.48, but some Pb may have been evaporated and removed by performing sintering, and the metal atom ratio (Pb:Ce:Zr:Ti) of the sintered Ce-doped PZT-based piezoelectric film became 1.15:0.03:0.52:0.48 and was represented by a general formula: $Pb_{1.15}Ce_{0.03}Zr_{0.52}Ti_{0.48}O_3$. In addition, a (100) plane orientation degree of the sintered PZT-based piezoelectric film was 88%.

Comparative Example 1

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.004:0.52:0.48. The metal atom ratio (Pb:Ce:Zr:Ti) of the PZT-based precursor was 1.15:0.004:0.52:0.48, but some Pb may have been evaporated and removed by performing sintering, and the metal atom ratio (Pb:Ce:Zr:Ti) of the sintered Ce-doped PZT-based piezoelectric film became 1.01:0.004:0.52:0.48 and was represented by a general formula: $Pb_{1.01}Ce_{0.004}Zr_{0.52}Ti_{0.48}O_3$. In addition, a (100) plane orientation degree of the sintered PZT-based piezoelectric film was 86%.

Comparative Example 2

A Ce-doped PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.15:0.06:0.40:0.60. The metal atom ratio (Pb:Ce:Zr:Ti) of the PZT-based precursor was 1.15:0.06:0.40:0.60, but some Pb may have been evaporated and removed by performing sintering, and the metal atom ratio (Pb:Ce:Zr:Ti) of the sintered Ce-doped PZT-based piezoelectric film became 1.04:0.06:0.40:0.60 and was represented by a general formula: $Pb_{1.04}Ce_{0.06}Zr_{0.40}Ti_{0.60}O_3$. In addition, a (100) plane orientation degree of the sintered PZT-based piezoelectric film was 72%.

Comparative Example 3

A PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the PZT-based precursor became 1.15:0:0.52:0.48 in which cerium 2-ethylhexanoate (Ce source) was not added. The metal atom ratio (Pb:Ce:Zr:Ti) of the PZT-based precursor was 1.15:0:0.52:0.48, but some Pb may have been evaporated and removed by performing sintering, and the metal atom ratio (Pb:Ce:Zr:Ti) of the sintered Ce-doped PZT-based piezoelectric film became 1.02:0:0.52:0.48 and was represented by a general formula: $Pb_{1.02}Zr_{0.52}Ti_{0.48}O_3$. In addition, a (100) plane orientation degree of the sintered PZT-based piezoelectric film was 76%.

Comparative Example 4

A PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the PZT-based precursor became 1.15:0.03:0.38:0.62. The metal atom ratio (Pb:Ce:Zr:Ti) of the PZT-based precursor was 1.15:0.03:0.38:0.62, but some Pb may have been evaporated and removed by performing sintering, and the metal atom ratio (Pb:Ce:Zr:Ti) of the sintered Ce-doped PZT-based piezoelectric film became 1.03:0.03:0.38:0.62 and was represented by a general formula: $Pb_{1.03}Ce_{0.03}Zr_{0.38}Ti_{0.62}O_3$. In addition, a (100) plane orientation degree of the sintered PZT-based piezoelectric film was 65%.

Comparative Example 5

A PZT-based piezoelectric film was formed in the same manner as in Example 1, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the PZT-based precursor became 1.15:0.03:0.57:0.43. The metal atom ratio (Pb:Ce:Zr:Ti) of the PZT-based precursor was 1.15:0.03:0.57:0.43, but some Pb may have been evaporated and removed by performing sintering, and the metal atom ratio (Pb:Ce:Zr:Ti) of the sintered Ce-doped PZT-based piezoelectric film became 1.03:0.03:0.57:0.43 and was represented by a general formula: $Pb_{1.03}Ce_{0.03}Zr_{0.57}Ti_{0.43}O_3$. In addition, a (100) plane orientation degree of the sintered PZT-based piezoelectric film was 88%.

Comparative Example 6

A Ce-doped PZT-based piezoelectric film was formed in the same manner as in Example 5, except for setting a mixing molar ratio of polyvinylpyrrolidone (PVP) so as to have 0.005 mole to 1 mole of the Ce-doped PZT-based precursor. In addition, a (100) plane orientation degree of the sintered PZT-based piezoelectric film was 90%.

Comparative Example 7

A Ce-doped PZT-based piezoelectric film was formed in the same manner as in Example 5, except for setting a mixing molar ratio of polyvinylpyrrolidone (PVP) so as to have 0.30 mole to 1 mole of the Ce-doped PZT-based precursor. In addition, a (100) plane orientation degree of the sintered PZT-based piezoelectric film was 68%.

Comparative Example 8

A Ce-doped PZT-based piezoelectric film was formed in the same manner as in Example 5, except for setting a mixing rate of propylene glycol (diol) as 15 mass % with respect to 100 mass % of the composition. In addition, a (100) plane orientation degree of the sintered PZT-based piezoelectric film was 87%.

Comparative Example 9

A Ce-doped PZT-based piezoelectric film was formed in the same manner as in Example 5, except for setting a mixing rate of propylene glycol (diol) as 60 mass % with respect to 100 mass % of the composition. In addition, a (100) plane orientation degree of the sintered PZT-based piezoelectric film was 80%.

Comparative Example 10

A Ce-doped PZT-based piezoelectric film was formed in the same manner as in Example 25, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 0.99:0.03:0.52:0.48. The metal atom ratio (Pb:Ce:Zr:Ti) of the PZT-based precursor was 0.99:0.03:0.52:0.48, but some Pb may have been evaporated and removed by performing sintering, and the metal atom ratio (Pb:Ce:Zr:Ti) of the sintered Ce-doped PZT-based piezoelectric film became 0.93:0.03:0.52:0.48 and was represented by a general formula: $Pb_{0.93}Ce_{0.03}Zr_{0.52}Ti_{0.48}O_3$. In addition, a (100) plane orientation degree of the sintered PZT-based piezoelectric film was 86%.

Comparative Example 11

A Ce-doped PZT-based piezoelectric film was formed in the same manner as in Example 25, except for weighing lead acetate trihydrate (Pb source), cerium 2-ethylhexanoate (Ce source), zirconium tetrabutoxide (Zr source), and titanium tetraisopropoxide (Ti source) so that a metal atom ratio (Pb:Ce:Zr:Ti) of the Ce-doped PZT-based precursor became 1.29:0.03:0.52:0.48. The metal atom ratio (Pb:Ce:Zr:Ti) of the PZT-based precursor was 1.29:0.03:0.52:0.48, but some Pb may have been evaporated and removed by performing sintering, and the metal atom ratio (Pb:Ce:Zr:Ti) of the sintered Ce-doped PZT-based piezoelectric film became 1.16:0.03:0.52:0.48 and was represented by a general formula: $Pb_{1.16}Ce_{0.03}Zr_{0.52}Ti_{0.48}O_3$. In addition, a (100) plane orientation degree of the sintered PZT-based piezoelectric film was 87%.

Comparative Test 1 and Evaluation

Regarding the Ce-doped PZT-based piezoelectric films formed in Examples 1 to 28 and Comparative Examples 1 to 11, a film composition, an orientation degree, deviation of the hysteresis, a dielectric constant, a piezoelectric constant $e_{31,f}$, and presence or absence of cracks were each evaluated.

A film composition (atom metal ratio) of the sintered Ce-doped PZT-based piezoelectric film shown in each example was measured by X-ray fluorescence analysis using an X-ray fluorescence spectrometer (type name: Primus 111+ manufactured by Rigaku Corporation).

A (100) plane orientation degree of the sintered PZT-based piezoelectric film film shown in each example was calculated by calculating strength of (100) plane/{strength of (100) plane+strength of (110) plane+strength of (111) plane} from a diffraction result obtained by a focusing method using an X-ray diffraction (XRD) device (type name: Empyrean manufactured by PANalytical B.V.).

The deviation of hysteresis of the piezoelectric film was measured by using an oscilloscope. Specifically, first, a pair of electrodes having a diameter of 200 μm were formed on the upper surface of the Ce-doped PZT-based piezoelectric film by using a sputtering method, and then the Ce-doped PZT-based piezoelectric film was subjected to the rapid heating process (RTA). Furthermore, the piezoelectric film was annealed to recover damage by maintaining in the oxygen atmosphere at 700° C. for 1 minute, and a metal-insulator-metal (MIM) capacitor structure was prepared. The metal-insulator-metal capacitor structure was used as a test sample.

The deviation of hysteresis was deviation from a bias 0 of the center of the hysteresis. When absolute values of positive and negative electric fields in a graph in which an X axis indicates the electric field (kV/cm) and Y axis indicates polarization quantity (μC/cm$^2$) were set as $E_c^+$ and $E_c^-$, the center of hysteresis was represented by the following formula.

The center of hysteresis=$E_c^+ - \{(E_c^+ + E_c^-)/2\}$

A dielectric constant of the piezoelectric film was measured by using a ferroelectrics evaluation device (TF-analyzer 2000 manufactured by aixACCT Systems). A piezoelectric constant $e_{31,f}$ was measured by using a piezoelectrics evaluation device (aixPES manufactured by aixACCT Systems). Specifically, first, the Pt upper electrode was formed on the Ce-doped PZT-based piezoelectric film and patterned and processed into a strip form. Then, the charge amount generated by applying strain to the Ce-doped PZT-based piezoelectric film was measured using a piezoelectrics evaluation device to obtain a piezoelectric constant $e_{31,f}$.

The presence or absence of cracks was determined from an SEM image obtained by imaging textures of a film surface and a film cross-section, using a scanning electron microscope (SEM) used in the film thickness measurement described above. Here, a crack was a crack having a short diameter equal to or greater than 30 nm and a long diameter equal to or greater than 200 nm in an SEM image having a size of 26 μm×19 μm (magnification: ×5000). The measurement was performed in three regions which were randomly selected from the piezoelectric film obtained in each of Examples and Comparative Examples. It was determined as "absence of cracks" when cracks were not observed, and it was determined as "presence of cracks" when cracks were observed. These results were shown in Table 1 and Table 2.

TABLE 1

| | Metal atom ratio in composition Pb:Ce:Zr:Ti | PVP (mole) | Diol (mass %) | Deviation of hysteresis (kV/cm) | Dielectric constant | $e_{31,f}$ (C/m$^2$) | Presence or absence of cracks |
|---|---|---|---|---|---|---|---|
| Example 1 | 1.15:0.005:0.40:0.60 | 0.02 | 30 | 4 | 1270 | −8.2 | Absent |
| Example 2 | 1.15:0.005:0.50:0.50 | 0.02 | 30 | 4 | 1000 | −12.1 | Absent |
| Example 3 | 1.15:0.005:0.52:0.48 | 0.02 | 30 | 5 | 1320 | −14.6 | Absent |
| Example 4 | 1.15:0.005:0.55:0.45 | 0.02 | 30 | 4 | 1350 | −12.9 | Absent |
| Example 5 | 1.15:0.01:0.40:0.60 | 0.02 | 30 | 5 | 750 | −7.1 | Absent |
| Example 6 | 1.15:0.01:0.50:0.50 | 0.02 | 30 | 6 | 1020 | −13.8 | Absent |
| Example 7 | 1.15:0.01:0.52:0.48 | 0.02 | 30 | 10 | 1200 | −16.1 | Absent |
| Example 8 | 1.15:0.01:0.55:0.45 | 0.02 | 30 | 16 | 1030 | −12.2 | Absent |
| Example 9 | 1.15:0.03:0.40:0.60 | 0.02 | 30 | 7 | 1010 | −10.1 | Absent |
| Example 10 | 1.15:0.03:0.50:0.50 | 0.02 | 30 | 12 | 930 | −15.2 | Absent |
| Example 11 | 1.15:0.03:0.52:0.48 | 0.02 | 30 | 9 | 1200 | −16.1 | Absent |
| Example 12 | 1.15:0.03:0.55:0.45 | 0.02 | 30 | 9 | 1180 | −14.2 | Absent |
| Example 13 | 1.15:0.05:0.40:0.60 | 0.02 | 30 | 14 | 940 | −9.2 | Absent |
| Example 14 | 1.15:0.05:0.50:0.50 | 0.02 | 30 | 13 | 850 | −14.3 | Absent |
| Example 15 | 1.15:0.05:0.52:0.48 | 0.02 | 30 | 15 | 1070 | −15.1 | Absent |
| Example 16 | 1.15:0.05:0.55:0.45 | 0.02 | 30 | 11 | 1000 | −12.3 | Absent |
| Comparative Example 1 | 1.15:0.004:0.52:0.48 | 0.02 | 30 | 1 | 1400 | −13.0 | Absent |
| Comparative Example 2 | 1.15:0.06:0.40:0.60 | 0.02 | 30 | 15 | 900 | −12.1 | Present |
| Comparative Example 3 | 1.15:0:0.52:0.48 | 0.02 | 30 | 0 | 1510 | −13.4 | Absent |
| Comparative Example 4 | 1.15:0.03:0.38:0.62 | 0.02 | 30 | 8 | 750 | −6.8 | Absent |
| Comparative Example 5 | 1.15:0.03:0.57:0.43 | 0.02 | 30 | 7 | 1060 | −11.2 | Absent |

TABLE 2

| | Metal atom ratio in composition Pb:Ce:Zr:Ti | PVP (mole) | Diol (mass %) | Deviation of hysteresis (kV/cm) | Dielectric constant | $e_{31,f}$ (C/m$^2$) | Presence or absence of cracks |
|---|---|---|---|---|---|---|---|
| Example 17 | 1.15:0.03:0.52:0.48 | 0.01 | 30 | 9 | 1150 | −15.8 | Absent |
| Example 18 | 1.15:0.03:0.52:0.48 | 0.025 | 30 | 10 | 1230 | −16.2 | Absent |
| Example 19 | 1.15:0.03:0.52:0.48 | 0.075 | 30 | 8 | 1350 | −17.1 | Absent |
| Example 20 | 1.15:0.03:0.52:0.48 | 0.25 | 30 | 10 | 1400 | −14.3 | Absent |
| Example 21 | 1.15:0.03:0.52:0.48 | 0.02 | 16 | 9 | 1200 | −15.3 | Absent |
| Example 22 | 1.15:0.03:0.52:0.48 | 0.02 | 28 | 9 | 1200 | −16.0 | Absent |
| Example 23 | 1.15:0.03:0.52:0.48 | 0.02 | 42 | 8 | 1230 | −16.3 | Absent |
| Example 24 | 1.15:0.03:0.52:0.48 | 0.02 | 56 | 10 | 1200 | −15.3 | Absent |
| Example 25 | 1.00:0.03:0.52:0.48 | 0.05 | 30 | 4 | 1350 | −16.4 | Absent |
| Example 26 | 1.05:0.03:0.52:0.48 | 0.05 | 30 | 8 | 1200 | −13.9 | Absent |
| Example 27 | 1.15:0.03:0.52:0.48 | 0.05 | 30 | 9 | 1180 | −15.1 | Absent |
| Example 28 | 1.28:0.03:0.52:0.48 | 0.05 | 30 | 8 | 1230 | −11.8 | Absent |
| Comparative Example 6 | 1.15:0.03:0.52:0.48 | 0.005 | 30 | 8 | 1100 | −13.2 | Present |
| Comparative Example 7 | 1.15:0.03:0.52:0.48 | 0.30 | 30 | 7 | 1150 | −10.1 | Absent |
| Comparative Example 8 | 1.15:0.03:0.52:0.48 | 0.02 | 15 | 8 | 1200 | −14.3 | Present |
| Comparative Example 9 | 1.15:0.03:0.52:0.48 | 0.02 | 60 | 7 | 1130 | −6.0 | Absent |
| Comparative Example 10 | 0.99:0.03:0.52:0.48 | 0.05 | 30 | 9 | 1190 | −7.2 | Absent |

TABLE 2-continued

|  | Metal atom ratio in composition Pb:Ce:Zr:Ti | PVP (mole) | Diol (mass %) | Deviation of hysteresis (kV/cm) | Dielectric constant | $e_{31,f}$ (C/m$^2$) | Presence or absence of cracks |
|---|---|---|---|---|---|---|---|
| Comparative Example 11 | 1.29:0.03:0.52:0.48 | 0.05 | 30 | 8 | 1200 | −8.0 | Absent |

As shown in Table 1, it was confirmed that the hysteresis was shifted to the negative side in accordance with the doping concentration of Ce by doping the composition for forming the PZT-based piezoelectric film with Ce. This was confirmed from a state where the deviation of hysteresis was the same regardless of different doping concentrations of Ce when Example 15 and Comparative Example 2 were compared to each other. This was because of different Zr/Ti ratios. Particularly, it was observed that the hysteresis was easily shifted to the negative side when the Zr/Ti ratio had a morphotropic phase boundary (MPB) composition (52/48), compared to Ti-rich composition (40/60).

In Comparative Example 1 where the doping amount of Ce was small, cracks were not generated, but a dielectric constant was as great as 1400. In Comparative Example 3 where the doping with Ce was not performed, cracks were not generated, but a dielectric constant was as great as 1510. In Comparative Example 2 where the doping amount of Ce was great, a dielectric constant was as small as 900, but cracks were generated. With respect to these Comparative Examples, in Examples 1 to 16 where the doping amount of Ce was in the appropriate range, a dielectric constant was as small as 750 to 1350 and cracks were not generated. In addition, it was found that, in Comparative Example 4 where the content of Zr was as small as 0.38, an absolute value of the piezoelectric constant $e_{31,f}$ was as small as 6.8 C/m$^2$, whereas in Examples 1 to 16 where the content of Zr was in the appropriate range, an absolute value of the piezoelectric constant $e_{31,f}$ was as great as 7.1 C/m$^2$ to 16.1 C/m$^2$ and a piezoelectric constant was improved.

As shown in Table 2, in Comparative Example 6 where the content of polyvinylpyrrolidone (PVP) was as small as 0.005 moles, an absolute value of the piezoelectric constant $e_{31,f}$ was comparatively as great as 13.2 C/m$^2$, but cracks were generated. In Comparative Example 7 where the content of polyvinylpyrrolidone (PVP) was as great as 0.30 moles, cracks were not generated, but an absolute value of the piezoelectric constant $e_{31,f}$ was as small as 10.1 C/m$^2$. In Comparative Example 8 where the content of propylene glycol (diol) was as small as 15 mass %, an absolute value of the piezoelectric constant $e_{31,f}$ was as great as 14.3 C/m$^2$, but cracks were generated. In Comparative Example 9 where the content of propylene glycol (diol) was as great as 60 mass %, cracks were not generated, and an absolute value of the piezoelectric constant $e_{31,f}$ was as small as 6.0 C/m$^2$. With respect to these Comparative Examples, it was found that, in Examples 17 to 24 where the content of polyvinylpyrrolidone (PVP) and propylene glycol (diol) was in the appropriate range, cracks were not generated, an absolute value of the piezoelectric constant $e_{31,f}$ was as great as 14.3 C/m$^2$ to 17.1 C/m$^2$, and a piezoelectric constant was improved. In addition, in Comparative Example 10 where the content ratio of Pb in the composition was as small as 0.99, an absolute value of the piezoelectric constant $e_{31,f}$ was as small as 7.2 C/m$^2$ and in Comparative Example 11 where the content ratio of Pb in the composition was as great as 1.21, an absolute value of the piezoelectric constant $e_{31,f}$ was as small as 8.0 C/m$^2$, whereas in Examples 25 to 28 where the content ratio of Pb in the composition was in the appropriate range of 1.00 to 1.28, an absolute value of the piezoelectric constant $e_{31,f}$ was not great and was in a range of 11.8 C/m$^2$ to 16.4 C/m$^2$. Therefore, it was found that a decrease in piezoelectric constant $e_{31,f}$ was caused when the content ratio z of Pb in the composition was beyond the range of $1.00 \leq z \leq 1.28$.

Regarding the Ce-doped PZT-based piezoelectric films formed in Example 15 and Comparative Example 2, hysteresis curves when deviation of hysteresis was measured in Comparative Test 1 were drawn in FIG. 4. As shown from the hysteresis curves drawn in FIG. 4, it was found that hysteresis of the piezoelectric film in Example 15 was shifted to the negative side, compared to hysteresis of the piezoelectric film in Comparative Example 2.

Hereinabove, the preferred examples of the present invention have been described, but the present invention was not limited to these examples. Addition, omission, replacement, and other modifications of the configuration can be performed within a range not departing from a scope of the present invention. The present invention was not limited to the descriptions described above and only limited to the range of accompanied claims.

INDUSTRIAL APPLICABILITY

The composition for forming a Ce-doped PZT-based piezoelectric film can be used in the manufacturing of a configuration material (electrode) of a composite electronic component such as a piezoelectric element, an IPD, or a pyroelectric element.

The invention claimed is:
1. A composition for forming a PZT-based piezoelectric film formed of Ce-doped composite metal oxides, the composition comprising:
PZT-based precursors containing metal atoms configuring the composite metal oxides;
a diol;
polyvinylpyrrolidone or polyethylene glycol; and
linear monoalcohol having 6 to 12 carbon atoms,
wherein the PZT-based precursors are contained so that a metal atom ratio (Pb:Ce:Zr:Ti) in the composition satisfies (1.00 to 1.28):(0.005 to 0.05):(0.40 to 0.55):(0.60 to 0.45) and the total of Zr and Ti in a metal atom ratio is 1 in the composition,
a concentration of the PZT-based precursor in 100 mass % of the composition is from 17 mass % to 35 mass % in terms of an oxide concentration,
a rate of diol in 100 mass % of the composition is from 16 mass % to 56 mass %,
a molar ratio of polyvinylpyrrolidone or polyethylene glycol to 1 mole of the PZT-based precursor is 0.01 moles to 0.25 moles in terms of monomers,
a rate of linear monoalcohol having 6 to 12 carbon atoms in 100 mass % of the composition is from 0.6 mass % to 10 mass %, and the linear monoalcohol having 6 to 12 carbon atoms is added to a synthetic liquid obtained by reflux and reacting the PZT-based precursors with the diol at a temperature of 130° C. to 175° C. for 0.5 hours to 3 hours.

2. The composition for forming a Ce-doped PZT-based piezoelectric film according to claim 1, wherein the metal atom ratio (Pb:Ce:Zr:Ti) in the composition satisfies (1.05 to 1.15):(0.01 to 0.03):(0.45 to 0.55):(0.45 to 0.55).

3. The composition for forming a Ce-doped PZT-based piezoelectric film according to claim 1, wherein the linear monoalcohol having 6 to 12 carbon atoms is one or more compounds selected from a group consisting of 1-hexanol, 1-heptanol, 1-octanol, 1-nonanol, 1-decanol, 1-undecanol, and 1-dodecanol.

4. The composition for forming a Ce-doped PZT-based piezoelectric film according to claim 2, wherein the linear monoalcohol having 6 to 12 carbon atoms is one or more compounds selected from a group consisting of 1-hexanol, 1-heptanol, 1-octanol, 1-nonanol, 1-decanol, 1-undecanol, and 1-dodecanol.

* * * * *

UNITED STATES PATENT AND TRADEMARK OFFICE
CERTIFICATE OF CORRECTION

PATENT NO. : 10,672,973 B2
APPLICATION NO. : 15/127981
DATED : June 2, 2020
INVENTOR(S) : Toshihiro Doi et al.

Page 1 of 1

It is certified that error appears in the above-identified patent and that said Letters Patent is hereby corrected as shown below:

In the Claims

Column 26, Line 50, "polyvinylpyrrolidone or polyethylene glycol;" should read
-- polyethylene glycol having a degree of polymerization of 200 to 400; --;
Line 62, cancel the text "polyvinylpyrrolidone";
Line 64, insert the word -- and -- after the "," at the end of the line;
Line 67, "mass %, and" should read -- mass %. --.

Column 27, Line 1, cancel the text beginning with "the linear monoalcohol" to
and ending "to 3 hours." in Column 27, Line 5.

Signed and Sealed this
Eighth Day of December, 2020

Andrei Iancu
*Director of the United States Patent and Trademark Office*